(12) United States Patent
Okano et al.

(10) Patent No.: US 11,296,020 B2
(45) Date of Patent: Apr. 5, 2022

(54) SEMICONDUCTOR DEVICE AND METHOD FOR MANUFACTURING THE SAME

(71) Applicant: SONY SEMICONDUCTOR SOLUTIONS CORPORATION, Kanagawa (JP)

(72) Inventors: Hitoshi Okano, Kanagawa (JP); Hiroyuki Kawashima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/772,263

(22) PCT Filed: Dec. 7, 2018

(86) PCT No.: PCT/JP2018/045035
§ 371 (c)(1),
(2) Date: Jun. 12, 2020

(87) PCT Pub. No.: WO2019/124112
PCT Pub. Date: Jun. 27, 2019

(65) Prior Publication Data
US 2021/0090987 A1 Mar. 25, 2021

(30) Foreign Application Priority Data

Dec. 21, 2017 (JP) .............................. JP2017-244941

(51) Int. Cl.
*H01L 23/522* (2006.01)
*H01L 21/768* (2006.01)
(Continued)

(52) U.S. Cl.
CPC .... *H01L 23/5223* (2013.01); *H01L 21/76843* (2013.01); *H01L 23/528* (2013.01);
(Continued)

(58) Field of Classification Search
CPC ........... H01L 23/5223; H01L 21/76843; H01L 23/528; H01L 28/60; H01L 27/14634;
(Continued)

(56) References Cited

U.S. PATENT DOCUMENTS

2016/0043060 A1* 2/2016 Kabe .................. H01L 24/80
257/774
2016/0268144 A1 9/2016 Voiron et al.
(Continued)

FOREIGN PATENT DOCUMENTS

JP H11-340419 12/1999
JP 2002-324851 11/2002
(Continued)

OTHER PUBLICATIONS

International Search Report and Written Opinion prepared by the Japanese Patent Office dated Feb. 18, 2019, for International Application No. PCT/JP2018/045035.

*Primary Examiner* — Patricia D Valenzuela
(74) *Attorney, Agent, or Firm* — Sheridan Ross P.C.

(57) ABSTRACT

The present technology relates to a semiconductor device in which a MIM capacitive element can be formed without any process damage, and a method for manufacturing the semiconductor device. In a semiconductor device, wiring layers of a first multilayer wiring layer formed on a first semiconductor substrate and a second multilayer wiring layer formed on a second semiconductor substrate are bonded to each other by wafer bonding. The semiconductor device includes a capacitive element including an upper electrode, a lower electrode, and a capacitive insulating film between the upper electrode and the lower electrode. One electrode of the upper electrode and the lower electrode is formed with a first conductive layer of the first multilayer wiring layer and a second conductive layer of the second multilayer wiring layer. The present technology can be applied to a semicon-
(Continued)

ductor device or the like formed by joining two semiconductor substrates, for example.

6 Claims, 13 Drawing Sheets

(51) Int. Cl.
*H01L 23/528* (2006.01)
*H01L 49/02* (2006.01)
*H01L 25/065* (2006.01)

(52) U.S. Cl.
CPC .......... *H01L 28/60* (2013.01); *H01L 23/5226* (2013.01); *H01L 25/0657* (2013.01)

(58) Field of Classification Search
CPC ............... H01L 27/14636; H01L 24/00; H01L 2224/08145; H01L 21/822; H01L 27/04; H01L 23/485; H01L 21/32051; H01L 23/5226; H01L 25/0657
See application file for complete search history.

(56) References Cited

U.S. PATENT DOCUMENTS

| 2017/0142838 | A1 | 5/2017 | Kurosawa |
| 2017/0194248 | A1* | 7/2017 | Das ................. H01L 23/528 |

FOREIGN PATENT DOCUMENTS

| JP | 2016-535441 | 11/2016 |
| JP | 2017-098527 | 6/2017 |
| WO | WO 2014/184988 | 11/2014 |

* cited by examiner

SEMICONDUCTOR DEVICE AND METHOD FOR MANUFACTURING THE SAME

CROSS REFERENCE TO RELATED APPLICATIONS

This application is a national stage application under 35 U.S.C. 371 and claims the benefit of PCT Application No. PCT/JP2018/045035 having an international filing date of 7 Dec. 2018, which designated the United States, which PCT application claimed the benefit of Japanese Patent Application No. 2017-244941 filed 21 Dec. 2017, the entire disclosures of each of which are incorporated herein by reference.

TECHNICAL FIELD

The present technology relates to a semiconductor device and a method for manufacturing the semiconductor device, and more particularly, to a semiconductor device in which a MIM capacitive element can be formed without any process damage, and a method for manufacturing the semiconductor device.

BACKGROUND ART

It is anticipated that the importance of capacitive elements mounted on analog CMOS circuits increases. For example, capacitive elements include a metal-oxide-semiconductor (MOS) capacitance in a front-end-of-line (FEOL) region, a metal-insulator-metal (MIM) capacitance and a metal-oxide-metal (MOM) capacitance in a back-end-of-line (BEOL) region, and the like. However, requiring a large mounting area (footprint), a capacitive element does not agree with the trend of transistor size reduction, and has a large influence on the chip size.

To increase the capacitance of a capacitive element, a high-dielectric-constant film may be used as a capacitive insulating film, or the surface area may be made larger. For example, for the MIM capacitance of a structure in which a thin capacitive insulating film is interposed between electrodes, a three-dimensional structure has been suggested to increase the surface area (see Patent Document 1, for example).

CITATION LIST

Patent Document

Patent Document 1: Japanese Patent Application Laid-Open No. 2002-324851

SUMMARY OF THE INVENTION

Problems to be Solved by the Invention

In the process of forming a MIM capacitance, there is a concern that the capacitive insulating film might be degraded due to the charge in the process of forming electrodes after the formation of a capacitive insulating film or in the process of forming contacts to be connected to the electrodes. Therefore, there is a demand for a technique that does not cause any process damage.

The present technology has been made in view of such circumstances, and aims to form a MIM capacitive element, without causing any process damage.

Solutions to Problems

A semiconductor device according to a first aspect of the present technology includes: a first multilayer wiring layer formed on a first semiconductor substrate, and a second multilayer wiring layer formed on a second semiconductor substrate, wiring layers of the first multilayer wiring layer and the second multilayer wiring layer being bonded to each other by wafer bonding; and a capacitive element including an upper electrode, a lower electrode, and a capacitive insulating film between the upper electrode and the lower electrode. One electrode of the upper electrode and the lower electrode is formed with a first conductive layer of the first multilayer wiring layer and a second conductive layer of the second multilayer wiring layer.

In the first aspect of the present technology, a wiring layer of a first multilayer wiring layer formed on a first semiconductor substrate and a wiring layer of a second multilayer wiring layer formed on a second semiconductor substrate are bonded to each other by wafer bonding, and a capacitive element including an upper electrode, a lower electrode, and a capacitive insulating film between the upper electrode and the lower electrode is provided. One electrode of the upper electrode and the lower electrode is formed with a first conductive layer of the first multilayer wiring layer and a second conductive layer of the second multilayer wiring layer.

A semiconductor device manufacturing method according to a second aspect of the present technology includes: bonding a wiring layer of a first multilayer wiring layer formed on a first semiconductor substrate and a wiring layer of a second multilayer wiring layer formed on a second semiconductor substrate to each other by wafer bonding, to form a capacitive element including an upper electrode, a lower electrode, and a capacitive insulating film between the upper electrode and the lower electrode; and forming one electrode of the upper electrode and the lower electrode with a first conductive layer of the first multilayer wiring layer and a second conductive layer of the second multilayer wiring layer.

In the first through third aspects of the present technology, a wiring layer of a first multilayer wiring layer formed on a first semiconductor substrate and a wiring layer of a second multilayer wiring layer formed on a second semiconductor substrate are bonded to each other by wafer bonding, to form a capacitive element including an upper electrode, a lower electrode, and a capacitive insulating film between the upper electrode and the lower electrode. One electrode of the upper electrode and the lower electrode is formed with a first conductive layer of the first multilayer wiring layer and a second conductive layer of the second multilayer wiring layer.

A semiconductor device manufacturing method according to a third aspect of the present technology includes: forming a capacitive insulating film on upper surfaces of a first conductive layer and a second conductive layer of a first multilayer wiring layer formed on a first semiconductor substrate; removing the capacitive insulating film on the upper surface of the second conductive layer of the first multilayer wiring layer; bonding a third conductive layer and a fourth conductive layer of a second multilayer wiring layer formed on a second semiconductor substrate to the first conductive layer and the second conductive layer, respectively, to form a capacitive element having the capacitive insulating film interposed between the first conductive layer as an upper electrode and the third conductive layer as a lower electrode, the third conductive layer and the fourth conductive layer facing the first conductive layer and the second conductive layer, respectively; and connecting the second conductive layer and the fourth conductive layer by metal joining.

In the first through third aspects of the present technology, a capacitive insulating film is formed on the upper surfaces of a first conductive layer and a second conductive layer of a first multilayer wiring layer formed on a first semiconductor substrate, and the capacitive insulating film on the upper surface of the second conductive layer of the first multilayer wiring layer is removed. A third conductive layer and a fourth conductive layer of a second multilayer wiring layer formed on a second semiconductor substrate are bonded to the first conductive layer and the second conductive layer, respectively, in such a manner that the third conductive layer and the fourth conductive layer face the first conductive layer and the second conductive layer, respectively, to form a capacitive element having the capacitive insulating film interposed between the first conductive layer as an upper electrode and the third conductive layer as a lower electrode. The second conductive layer and the fourth conductive layer are connected by metal joining.

A semiconductor device may be an independent device, or may be a module to be incorporated into some other device.

Effects of the Invention

According to the first through third aspects of the present technology, it is possible to form a MIM capacitive element, without causing any process damage.

Note that the effects of the present technology are not necessarily limited to the effects described herein, and may include any of the effects described in the present disclosure.

MODES FOR CARRYING OUT THE INVENTION

Figure 1:
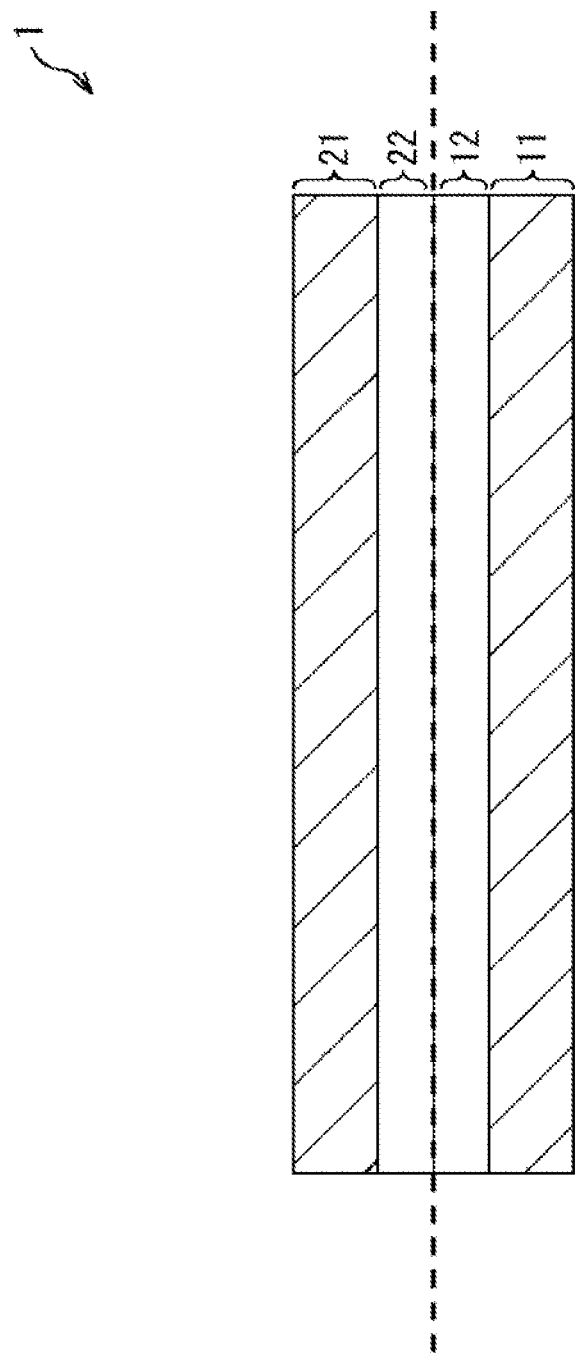
FIG. 1 is a schematic cross-sectional view of a semiconductor device to which the present technology is applied.

The following is a description of modes (hereinafter referred to as embodiments) for carrying out the present technology. Note that explanation will be made in the following order.

1. Schematic cross-sectional view of a semiconductor device
2. First example configuration
3. Second example configuration
4. Third example configuration
5. Fourth example configuration
6. Fifth example configuration
7. Sixth example configuration
8. First manufacturing method
9. Second manufacturing method
10. Third manufacturing method
11. Example of application to a solid-state imaging device <1. Schematic Cross-Sectional View of a Semiconductor Device>

FIG. 1 is a schematic cross-sectional view of a semiconductor device to which the present technology is applied.

A semiconductor device 1 shown in FIG. 1 includes a multilayer wiring layer 12 (a first multilayer wiring layer) formed on a first semiconductor substrate 11 (a first wafer) and a multilayer wiring layer 22 (a second multilayer wiring layer) formed on a second semiconductor substrate 21 (a second wafer), and the wiring layers are bonded to each other by wafer bonding. Wafer bonding is bonding in which the metallic films on the surfaces of the wiring layers of the multilayer wiring layer 12 and the multilayer wiring layer 22, such as copper (Cu) electrodes, are bonded at the wafer level by metal joining, for example.

The dashed line shown in FIG. 1 indicates the junction plane between the multilayer wiring layer 12 on the side of the first semiconductor substrate 11 and the multilayer wiring layer 22 on the side of the second semiconductor substrate 21.

In the semiconductor device 1 in FIG. 1, a metal-insulator-metal (MIM) capacitive element is formed in the junction plane between the multilayer wiring layer 12 and the multilayer wiring layer 22. In the description below, the MIM capacitive element formed in the junction plane will be described.

<2. First Example Configuration>

Figure 2:
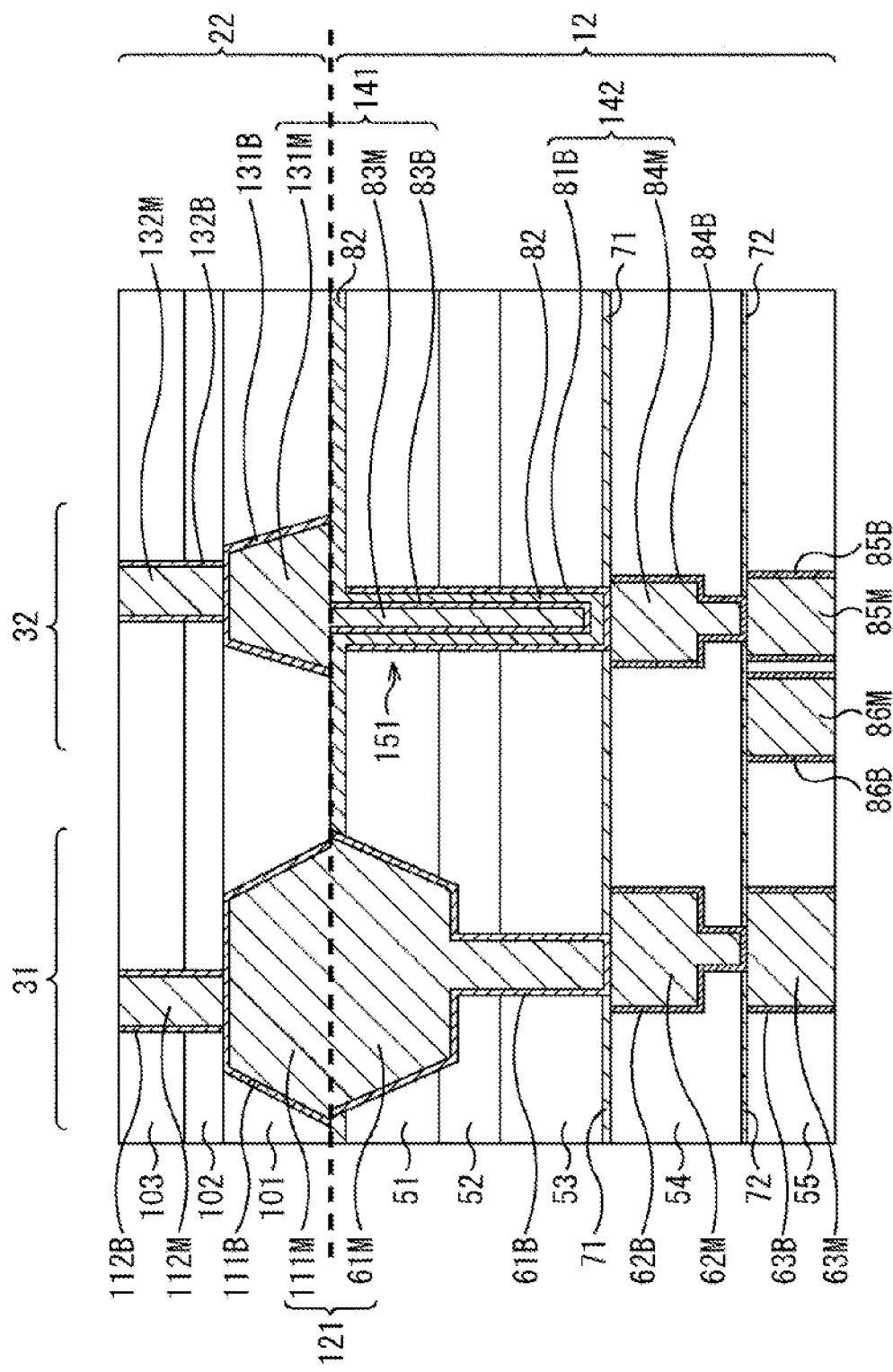
FIG. 2 is an enlarged sectional view of a first example configuration of wiring layers.

FIG. 2 is an enlarged sectional view of a first example configuration of wiring layers in the vicinity of the junction plane of the semiconductor device 1 shown in FIG. 1.

A plurality of insulating layers 51 through 55 is stacked on the multilayer wiring layer 12 on the side of the first semiconductor substrate 11, and a plurality of insulating layers 101 through 103 is stacked on the multilayer wiring layer 22 on the side of the second semiconductor substrate 21. The wiring layers of the multilayer wiring layer 12 on the side of the first semiconductor substrate 11 and the multilayer wiring layer 22 on the side of the second semiconductor substrate 21 are then bonded to each other by wafer bonding.

In a predetermined first region 31 in the planar direction of the multilayer wiring layer 12 on the side of the first semiconductor substrate 11, a metallic film 61M and a barrier metal 61B are formed in the three insulating layers 51 through 53, and a metallic film 62M and a barrier metal 62B are formed in the insulating layer 54, and a metallic film 63M and a barrier metal 63B are formed in the insulating layer 55.

The barrier metal 61B is formed on the outer periphery of the metallic film 61M buried in the three insulating layers 51 through 53. In other words, the barrier metal 61B is formed between the three insulating layers 51 through 53 and the metallic film 61M. Likewise, the barrier metal 62B is formed between the insulating layer 54 and the metallic film 62M, and the barrier metal 63B is formed between the insulating layer 55 and the metallic film 63M.

The metallic film 61M in the insulating layers 51 through 53 and the metallic film 62M in the insulating layer 54 are connected via the barrier metal 61B, and the metallic film 62M in the insulating layer 54 and the metallic film 63M in the insulating layer 55 are connected via the barrier metal 62B. Accordingly, the metallic films 61M through 63M are electrically connected. The material of the metallic films 61M through 63M is copper (Cu), for example.

A cap film 71 is formed between the insulating layers 53 and 54, and a cap film 72 is formed between the insulating layers 54 and 55. The material of the insulating layers 51 through 53 is a low-dielectric-constant film (a low-k film), a silicon oxide film, a silicon nitride film, or the like, for example. The insulating layers 51 through 53 may include the same material, or may include different materials.

Meanwhile, in a first region 31 of the multilayer wiring layer 22 on the side of the second semiconductor substrate 21, a metallic film 111M and a barrier metal 111B are formed in the insulating layer 101, and a metallic film 112M and a barrier metal 112B are formed in the insulating layers 102 and 103.

The barrier metal 111B is formed on the outer periphery of the metallic film 111M buried in the insulating layer 101. In other words, the barrier metal 111B is formed between the insulating layer 101 and the metallic film 111M. Likewise, the barrier metal 112B is formed between the insulating layers 102 and 103 and the metallic film 112M.

The metallic film 111M in the insulating layer 101 and the metallic film 112M in the insulating layers 102 and 103 are connected via the barrier metal 111B, and the metallic films HIM and 112M are electrically connected. The material of the metallic films HIM and 112M is copper (Cu), for example. The material of the insulating layers 101 through 103 is a low-dielectric-constant film (a low-k film), a silicon oxide film, a silicon nitride film, or the like, for example. The insulating layers 101 through 103 may include the same material, or may include different materials.

In the first region 31 formed as described above, the metallic film 61M formed in the insulating layer 51 of the multilayer wiring layer 12 on the side of the first semiconductor substrate 11, and the metallic film 111M formed in the insulating layer 101 of the multilayer wiring layer 22 on the side of the second semiconductor substrate 21 are joined to each other by metal joining, and the metallic film 61M and the metallic film 111M constitute a Cu pad 121 having a Cu—Cu junction structure. The Cu pad 121 transmits predetermined signals between the first semiconductor substrate 11 and the second semiconductor substrate 21.

In a predetermined second region 32 in the planar direction of the multilayer wiring layer 12 on the side of the first semiconductor substrate 11, a barrier metal 81B, an insulating film 82, a barrier metal 83B, and a metallic film 83M are stacked in a U-like shape in the three insulating layers 51 through 53. The insulating film 82 is formed between the barrier metal 81B and the barrier metal 83B.

Further, a metallic film 84M and a barrier metal 84B are formed in the insulating layer 54, and a metallic film 85M and a barrier metal 85B, and a metallic film 86M and a barrier metal 86B are formed in the insulating layer 55.

The barrier metal 84B is formed on the outer periphery of the metallic film 84M buried in the insulating layer 54. In other words, the barrier metal 84B is formed between the insulating layer 54 and the metallic film 84M. Likewise, the barrier metal 85B is formed between the insulating layer 55 and the metallic film 85M, and the barrier metal 86B is formed between the insulating layer 55 and the metallic film 36M.

The barrier metal 81B in the insulating layers 51 through 53 and the metallic film 84M in the insulating layer 54 are connected, and the metallic film 84M in the insulating layer 54 and the metallic film 35M in the insulating layer 55 are connected via the barrier metal 84B. Accordingly, the barrier metal 81B, the metallic film 84M, and the metallic film 85M are electrically connected. The material of the metallic films 33M through 36M is copper (Cu), for example.

Meanwhile, in the second region 32 of the multilayer wiring layer 22 on the side of the second semiconductor substrate 21, a metallic film 131M and a barrier metal 131B are formed in the insulating layer 101, and a metallic film 132M and a barrier metal 132B are formed in the insulating layers 102 and 103.

The barrier metal 131B is formed on the outer periphery of the metallic film 131M buried in the insulating layer 101. In other words, the barrier metal 131B is formed between the insulating layer 101 and the metallic film 131M. Likewise, the barrier metal 132B is formed between the insulating layers 102 and 103 and the metallic film 132M. The material of the metallic films 131M and 132M is copper (Cu), for example.

In the second region 32 formed as described above, the metallic film 83M formed in the insulating layers 51 through 53 of the multilayer wiring layer 12 on the side of the first semiconductor substrate 11, and the metallic film 131M formed in the insulating layer 101 of the multilayer wiring layer 22 on the side of the second semiconductor substrate 21 are connected directly to each other by metal joining, and the metallic film 83M and the metallic film 131M are electrically connected.

In the second region 32, the metallic film 131M of the multilayer wiring layer 22, and the metallic film 33M and the barrier metal 83B of the multilayer wiring layer 12 constitute an upper electrode 141, for example. The barrier metal 31B and the metallic film 84M of the multilayer wiring layer 12 constitute a lower electrode 142. The insulating film 82 between the barrier metal 81B and the barrier metal 83B serves as a capacitive insulating film between the upper electrode 141 and the lower electrode 142. Thus, a MIM capacitive element 151 is formed.

The upper electrode 141, which is one of the electrodes of the MIM capacitive element 151, is formed with conductive layers of the multilayer wiring layer 12 formed on the first semiconductor substrate 11 and a conductive layer of the multilayer wiring layer 22 formed on the second semiconductor substrate 21. More specifically, the upper electrode 141 is formed with the metallic film 33M and the barrier metal 83B of the multilayer wiring layer 12, and the metallic film 131M of the multilayer wiring layer 22. Although the manufacturing method will be described later, such a configuration is adopted, so that the MIM capacitive element 151 can be formed without any process damage to the insulating film 62 serving as the capacitive insulating film, Further, having a U-shaped three-dimensional structure, the MIM capacitive element 151 can realize a small mounting area (footprint).

As the multilayer wiring layer 12 of the first semiconductor substrate 11 and the multilayer wiring layer 22 of the second semiconductor substrate 21 are bonded to each other by wafer bonding, the upper surface of the metallic film 83M of the multilayer wiring layer 12 and the lower surface of the metallic film 131M of the multilayer wiring layer 22 coincide with the junction plane indicated by the dashed line, and exist in the same plane.

Note that the material of the barrier metal 81B and the barrier metal 83B may be tantalum (Ta), titanium (Ti), tungsten (W), zirconium (Zr), a nitride film of any of these elements, a carbide film of any of these elements, or the like, for example. The same applies to the other barrier metals.

<3. Second Example Configuration>

Figure 3:
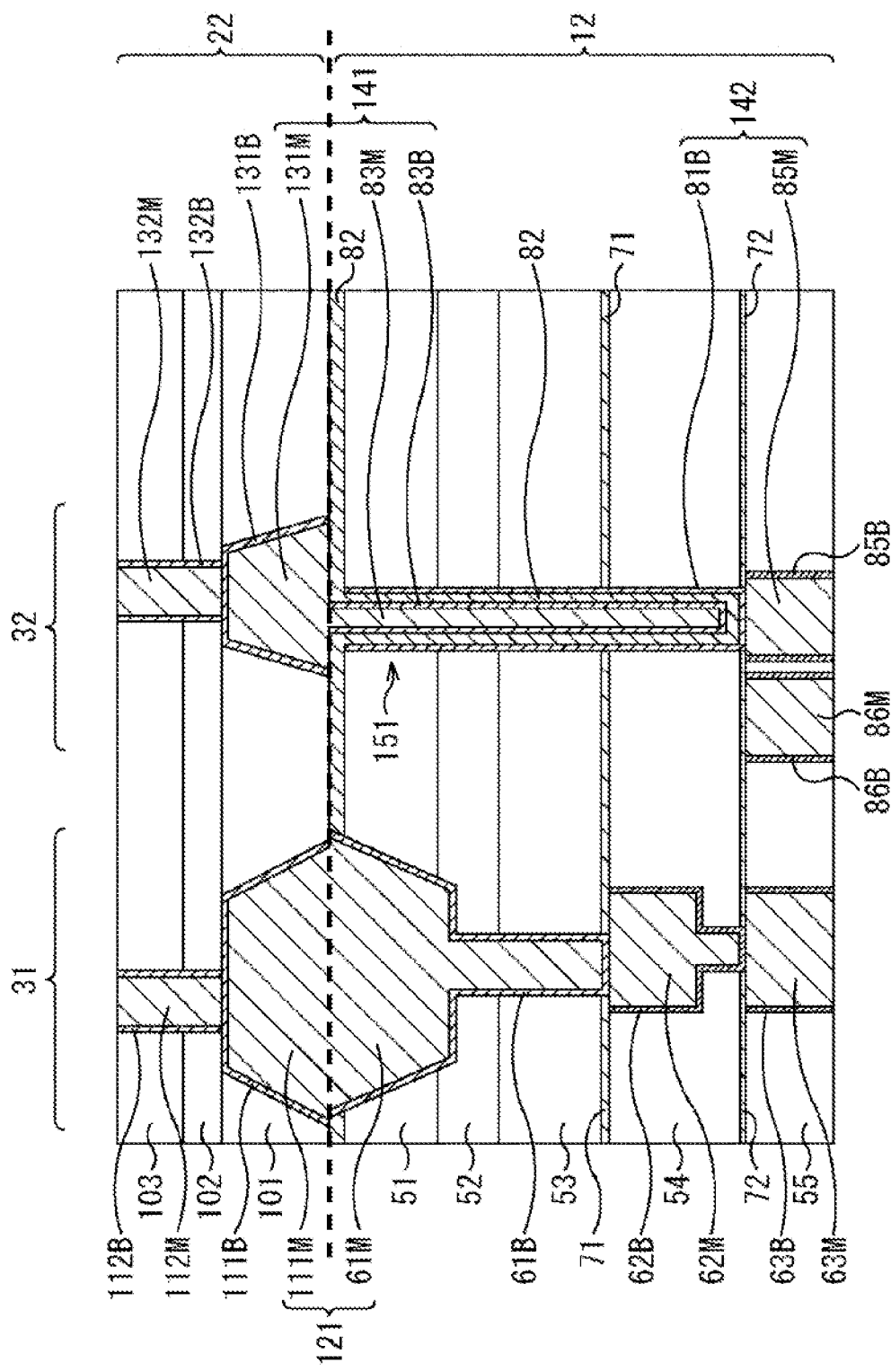
FIG. 3 is an enlarged sectional view of a second example configuration of wiring layers.

FIG. 3 is an enlarged sectional view of a second example configuration of wiring layers in the vicinity of the junction plane of the semiconductor device 1 shown in FIG. 1.

In FIG. 3, the components equivalent to those of the first example configuration shown in FIG. 2 are denoted by the same reference numerals as those used in FIG. 2, and explanation of the components will not be unnecessarily repeated. The wiring structure formed in the first region 31 in FIG. 3 is similar to that of the first example configuration example shown in FIG. 2, and only the wiring structure formed in the second region 32 differs from that of the first example configuration.

In the first example configuration shown in FIG. 2, the barrier metal 81B, the insulating film 82, the barrier metal 83B, and the metallic film 83M stacked in a U-shape are formed to have such a depth as to reach the three insulating layers 51 through 53 in the second region 32.

In the second example configuration shown in FIG. 3, on the other hand, the barrier metal 81B, the insulating film 82, the barrier metal 83B, and the metallic film 83M stacked in a U-shape are formed to have such a depth as to reach the four insulating layers 51 through 54. With this arrangement, the metallic film 84M and the barrier metal 84B formed in the insulating layer 54 in the first example configuration shown in FIG. 2 are omitted. The other components of the second example configuration are similar to those of the first example configuration.

The second example configuration differs from the first example configuration in that the lower electrode 142, which is one of the electrodes of the MIM capacitive element 151, is formed with the barrier metal 81B of the multilayer wiring layer 12 and the metallic film 85M in the insulating layer 55.

On the other hand, the second example configuration is similar to the first example configuration in that the upper electrode 141, which is one of the electrodes of the MIM capacitive element 151, is formed with the portion at which the conductive layers of the two wafers are joined. Specifically, the upper electrode 141 is formed with the metallic film 83M and the barrier metal 33B, which are the conductive layers of the multilayer wiring layer 12 of the first semiconductor substrate 11, and the metallic film 131M, which is the conductive layer of the multilayer wiring layer 22 of the second semiconductor substrate 21. Thus, it is possible to form the MIM capacitive element 151, without causing process damage in the step of forming the electrodes or in the step of forming the contacts to be connected to the electrodes.

<4. Third Example Configuration>

Figure 4:
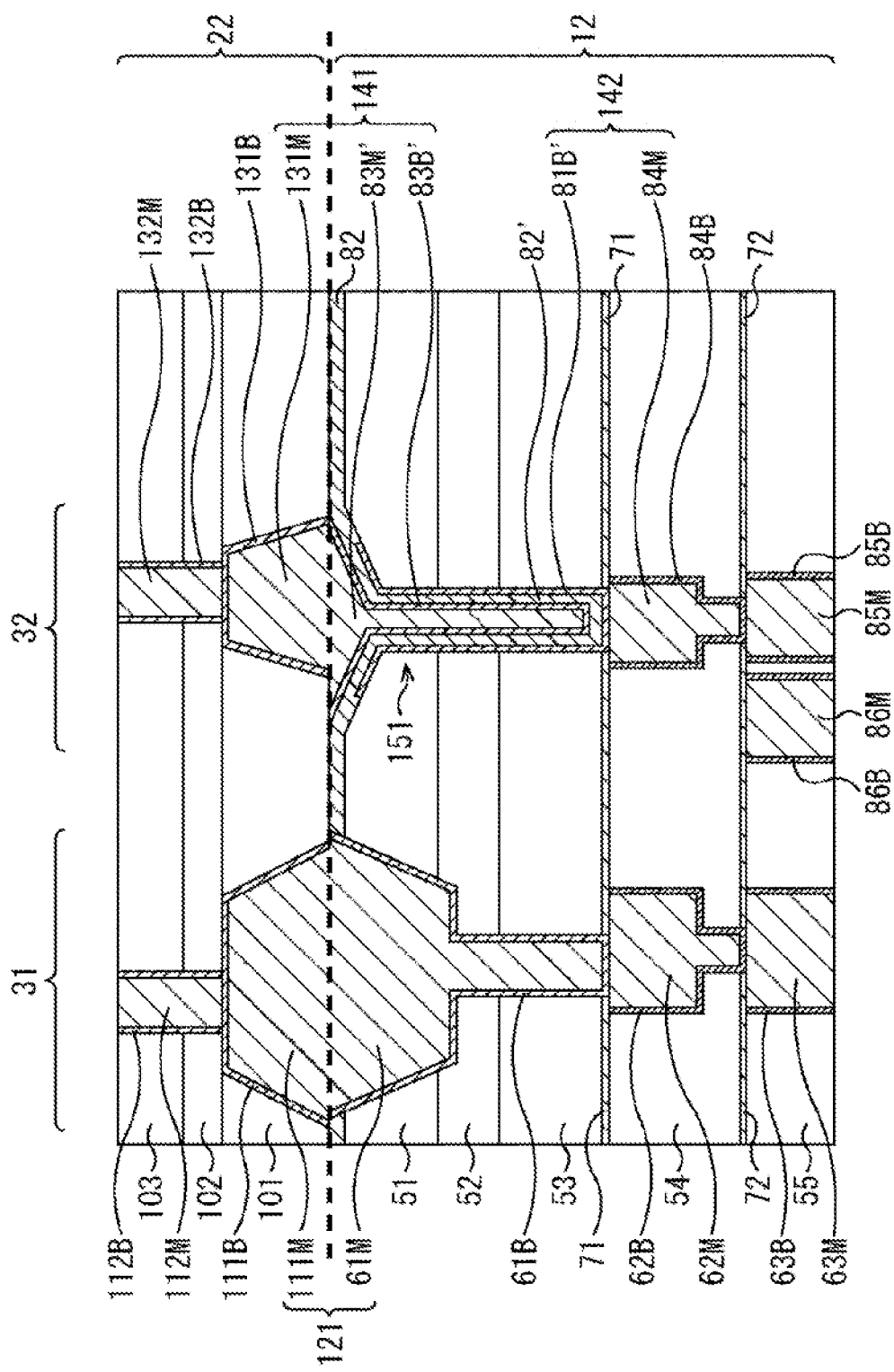
FIG. 4 is an enlarged sectional view of a third example configuration of wiring layers.

FIG. 4 is an enlarged sectional view of a third example configuration of wiring layers in the vicinity of the junction plane of the semiconductor device 1 shown in FIG. 1.

In FIG. 4, the components equivalent to those of the first example configuration shown in FIG. 2 are denoted by the same reference numerals as those used in FIG. 2, and explanation of the components will not be unnecessarily repeated.

In the first example configuration shown in FIG. 2, the barrier metal 81B, the insulating film 82, the barrier metal 83B, and the metallic film 83M stacked in a U-shape have the same opening width (opening diameter) as the three insulating layers 51 through 53.

In the third example configuration shown in FIG. 4, on the other hand, cross-sections of a barrier metal 81B', an insulating film 82', a barrier metal 83B', and a metallic film 83M' at the portion in contact with the junction plane above the insulating layer 51 each have a tapered shape, and the opening width of the junction plane is greater than the opening widths of the insulating layers 52 and 53.

Further, in the first example configuration shown in FIG. 2, the barrier metal 81B forming part of the lower electrode 142 is formed to reach the upper surface of the insulating layer 51. In the third example configuration shown in FIG. 4, on the other hand, the barrier metal 81B' is formed only to reach a position lower than the upper surface of the insulating layer 51 by a predetermined amount. As the barrier metal 81B' forming part of the lower electrode 142 is set back from the upper surface of the insulating layer 51, wider distances from the metallic film 131M and the metallic film 83M' constituting the upper electrode 141 are secured. Thus, short-circuiting can be avoided, and reliability can be increased.

<5. Fourth Example Configuration>

Figure 5:
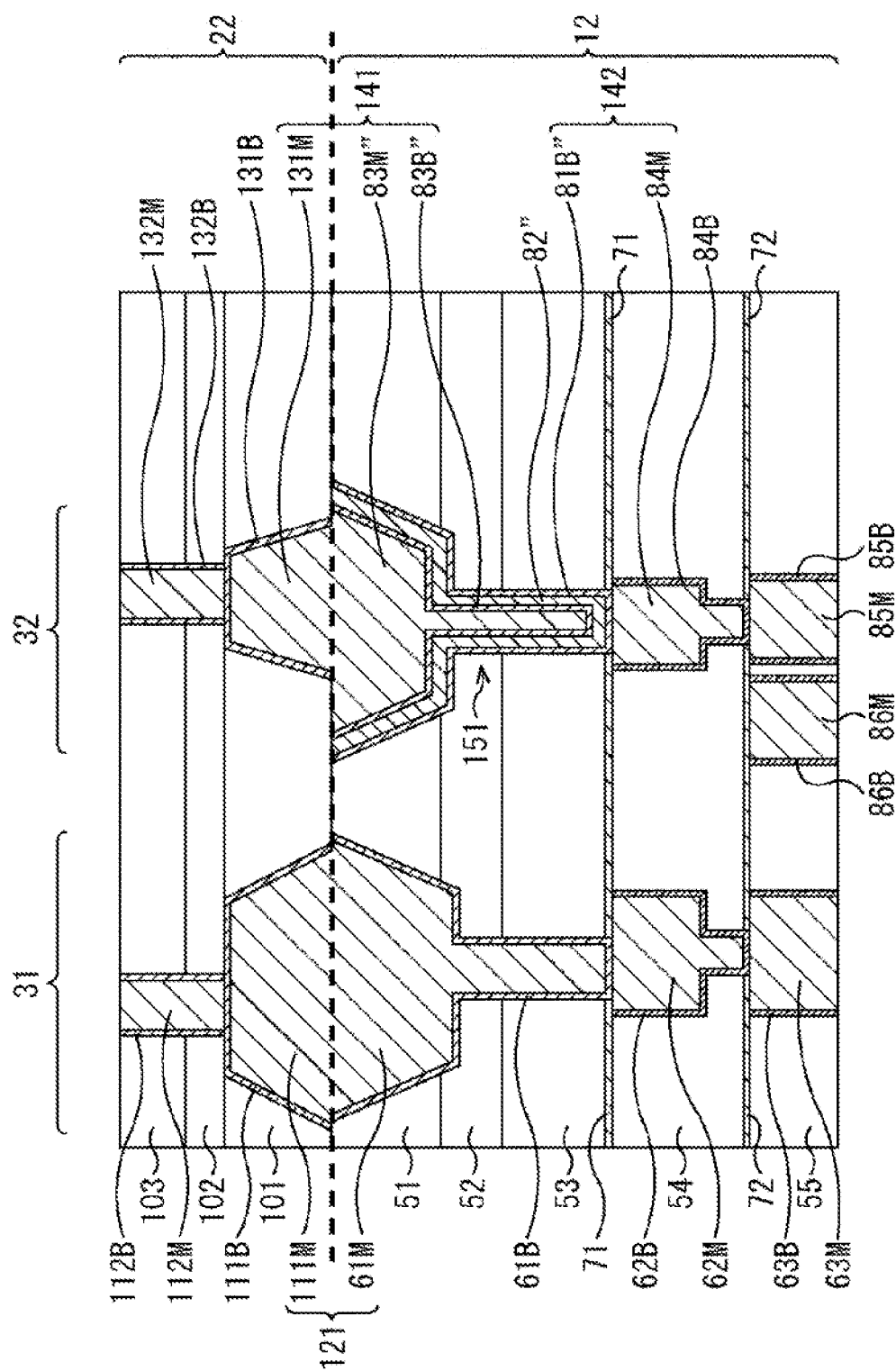
FIG. 5 is ail enlarged sectional view of a fourth example configuration of wiring layers.

FIG. 5 is an enlarged sectional view of a fourth example configuration of wiring layers in the vicinity of the junction plane of the semiconductor device 1 shown in FIG. 1.

In FIG. 5, the components equivalent to those of the first example configuration shown in FIG. 2 are denoted by the same reference numerals as those used in FIG. 2, and explanation of the components will not be unnecessarily repeated.

In the first example configuration shown in FIG. 2, the barrier metal 81B, the insulating film 82, the barrier metal 83B, and the metallic film 83M stacked in a U-shape have the same opening width as the three insulating layers 51 through 53.

In the fourth example configuration shown in FIG. 5, on the other hand, the cross-sectional shapes of a barrier metal 81B", an insulating film 82", a barrier metal 33B", and a metallic film 83M" formed in the insulating layer 51 are the same as the trapezoidal shape of the Cu pad 121 in in the first region 31.

The excavated portion for burying the metallic film 83M" and the like in the second region 32 is formed by the same method for forming the excavated portion for burying the metallic film 61M and the barrier metal 61B of the Cu pad 121 in the first region 31. Thus, the trapezoidal MIM capacitive element 151 shown in FIG. 5 can be formed.

<6. Fifth Example Configuration>

Figure 6:
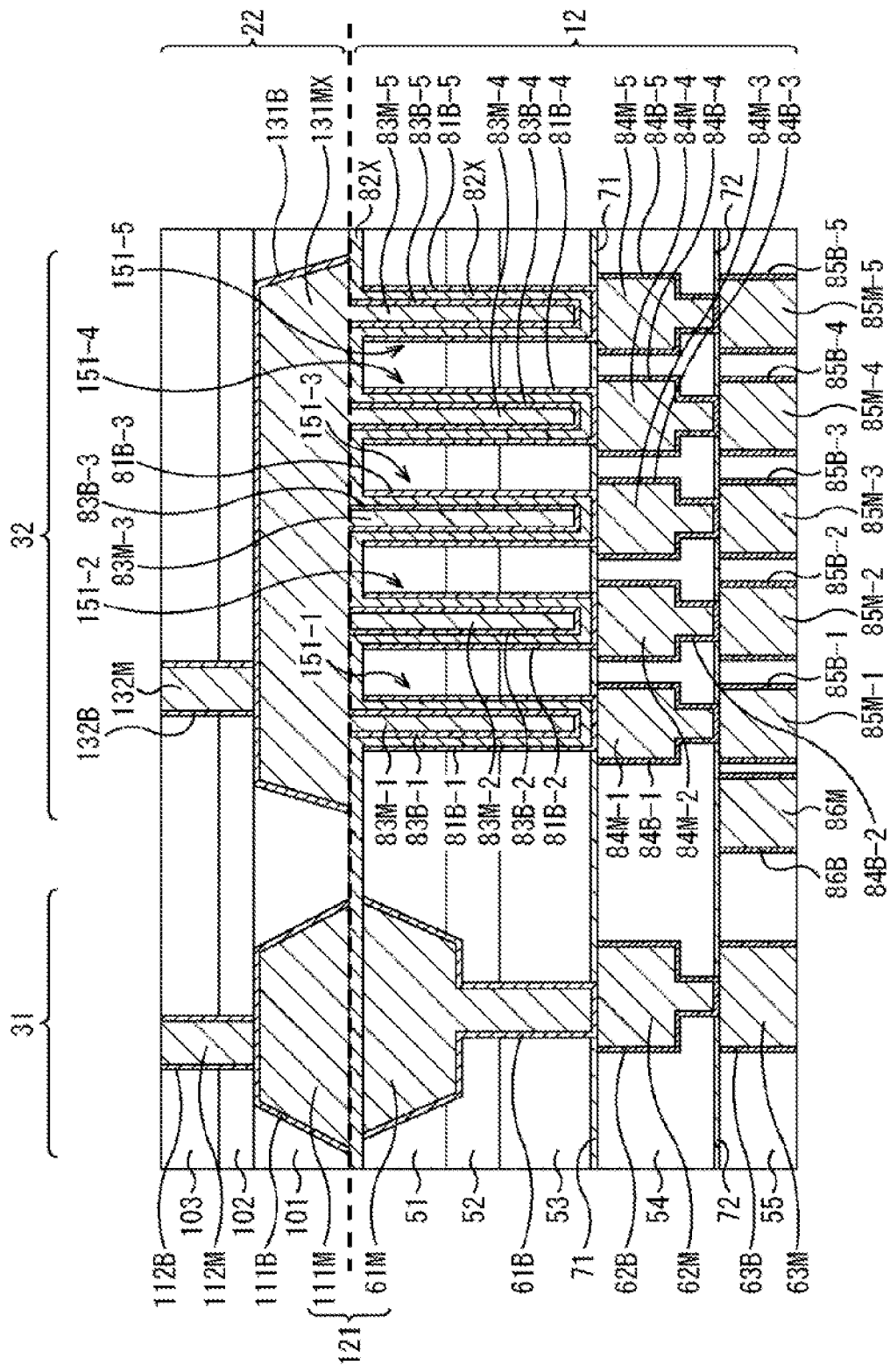
FIG. 6 is an enlarged sectional view of a fifth example configuration of wiring layers.

FIG. 6 is an enlarged sectional view of a fifth example configuration of wiring layers in the vicinity of the junction plane of the semiconductor device 1 shown in FIG. 1.

In FIG. 6, the components equivalent to those of the first example configuration shown in FIG. 2 are denoted by the same reference numerals as those used in FIG. 2, and explanation of the components will not be unnecessarily repeated. Note that, due to limitations of space. FIG. 6 does not show some of the reference numerals mentioned below.

In the fifth example configuration shown in FIG. 6, five MIM capacitive elements 151-1 through 151-5 having the same configuration as the MIM capacitive element 151 of the first example configuration are formed in parallel in the portion of the junction plane between the multilayer wiring layer 12 of the first semiconductor substrate 11 and the multilayer wiring layer 22 of the second semiconductor substrate 21.

A metallic film 131MX forming the upper electrode 141 on the side of the multilayer wiring layer 22 of the second semiconductor substrate 21 is formed and shared among the five MIM capacitive elements 151-1 through 151-5. The metallic film 131MX is joined to metallic films 83M-1 through 83M-5 formed in the multilayer wiring layer 12 of the first semiconductor substrate 11 at the junction plane by metal joining.

The metallic films 83M-1 through 83M-5 and barrier metals 83B-1 through 83B-5 formed in the multilayer wiring layer 12 of the first semiconductor substrate 11, together with the metallic film 131MX of the multilayer wiring layer 22 of the second semiconductor substrate 21, constitute upper electrodes 141-1 through 141-5 of the five MIM capacitive elements 151-1 through 151-5, respectively.

Barrier metals 81B-1 through 81B-5 and metallic films 84M-1 through 84-5 formed in the multilayer wiring layer 12 of the first semiconductor substrate 11 constitute lower electrodes 142-1 through 142-5 of the five MIM capacitive elements 151-1 through 151-5, respectively.

An insulating film 82X as the capacitive insulating film for the five MIM capacitive elements 151-1 through 151-5 is formed between the barrier metals 81B-1 through 81B-5 constituting part of the lower electrodes 142-1 through 142-5, and the barrier metals 83B-1 through 83B-5 constituting part of the upper electrodes 141-1 through 141-5.

As described above, a plurality of MIM capacitive elements 151 of the first example configuration may be formed in parallel, and be used as capacitive elements such as DRAM devices. In this case, it is also possible to form the MIM capacitive elements 151, without causing process damage to the insulating film 82X serving as the capacitive insulating film. Further, it is possible to form a logic-mixed memory without a complicated process flow that is required in manufacturing a DRAM.

<7. Sixth Example Configuration>

Figure 7:
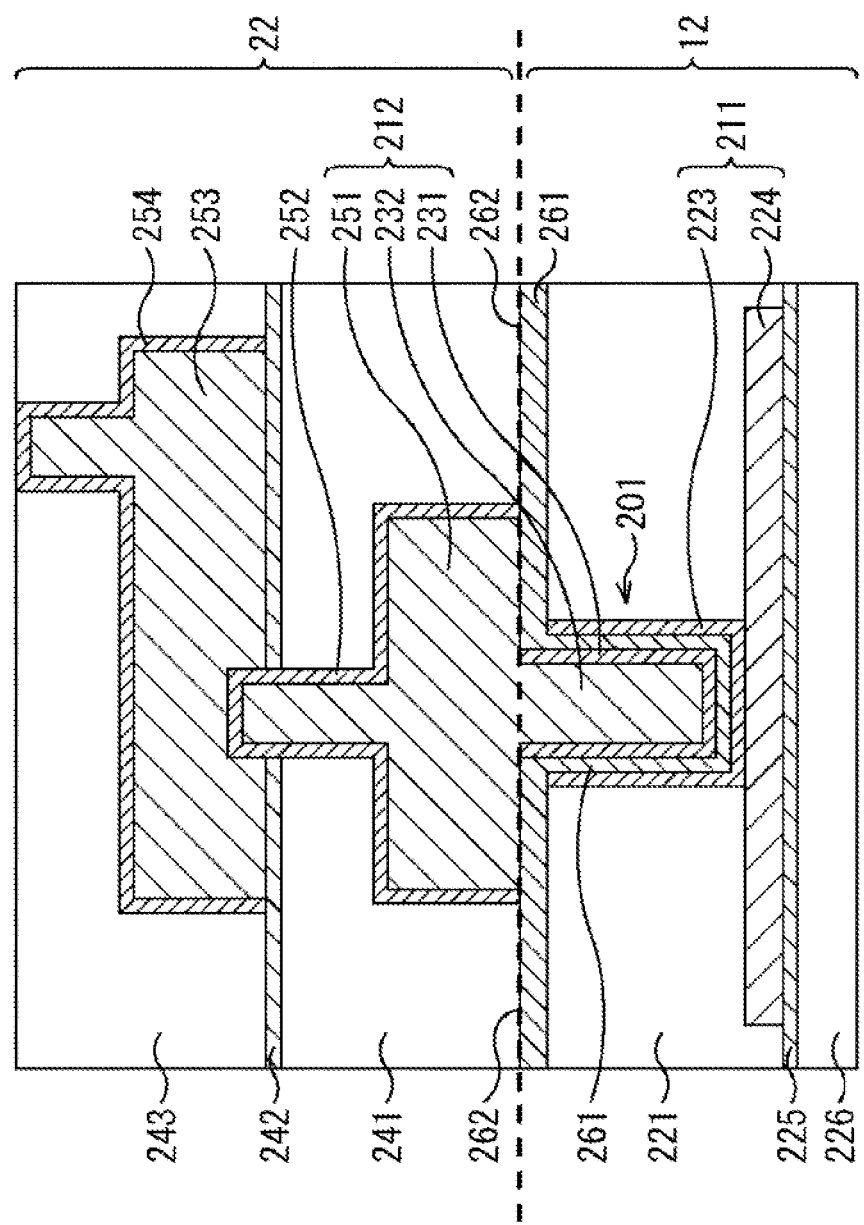
FIG. 7 is an enlarged sectional view of a sixth example configuration of wiring layers.

FIG. 7 is an enlarged sectional view of a sixth example configuration of wiring layers in the vicinity of the junction plane of the semiconductor device 1 shown in FIG. 1.

A MIM capacitive element 201 is formed in the vicinity of the junction plane between the multilayer wiring layer 12 of the first semiconductor substrate 11 and the multilayer wiring layer 22 of the second semiconductor substrate 21.

A lower electrode 211 of the MIM capacitive element 201 is formed with a barrier metal 223 and a metallic film 224 in an insulating layer 221 formed on the side of the multilayer wiring layer 12 closest to the junction plane. Under the metallic film 224, an insulating layer 226 is laminated via a cap film 225.

Meanwhile, an upper electrode 212 of the MIM capacitive element 201 is formed with a barrier metal 231 and a metallic film 232 in an insulating layer 221 of the multilayer wiring layer 12, and a metallic film 251 in an insulating layer 241 formed on the side of the multilayer wiring layer 22 closest to the junction plane.

The metallic film 251 in the insulating layer 241 is connected to a metallic film 253 formed in an insulating layer 243 above the insulating layer 241 via a barrier metal 252, and a cap film 242 is inserted between the insulating layer 241 and the insulating layer 243 excluding the contact portion. In the insulating layer 243, the outer periphery of the metallic film 253 is coated with a barrier metal 254.

In the insulating layer 221, a capacitive insulating film 261 is formed between the barrier metal 231 forming part of the upper electrode 212 and the barrier metal 223 forming part of the lower electrode 211. The capacitive insulating film 261 is also formed on the upper surface (outer surface) of the insulating layer 221 in contact with the junction plane.

Further, of the upper surface of the capacitive insulating film 261 formed on the upper surface of the insulating layer 221, the surface in contact with the insulating layer 241 of the multilayer wiring layer 22 has an ultra-thin insulating film 262 having a thickness of 1 nm or smaller formed thereon. As this ultra-thin insulating film 262 is formed on the entire surface of the multilayer wiring layer 12, the insulating film 262 is also formed on the junction plane between the metallic film 232 and the metallic film 251 halfway through the process. However, due to a volume expansion of each of the metallic films 232 and 251 caused by the heat treatment at the time of wafer bonding, the insulating film 262 in the junction plane between the metallic film 232 and the metallic film 251 eventually disappears. Still, the ultra-thin insulating film 262 might remain or voids might be formed at some portions in the junction plane between the metallic film 232 and the metallic film 251, and such states are also regarded as states in which the metallic film 232 and the metallic film 251 are joined directly to each other.

Note that, in FIG. 7, the area of the junction plane of the metallic film 232 of the multilayer wiring layer 12 forming the upper electrode 212 is smaller than the area of the junction plane of the metallic film 251 of the multilayer wiring layer 22. However, the area of the junction plane of the metallic film 232 and the area of the junction plane of the metallic film 251 may be the same, or the area of the metallic film 232 on the side of the multilayer wiring layer 12 may be larger.

Figure 8:
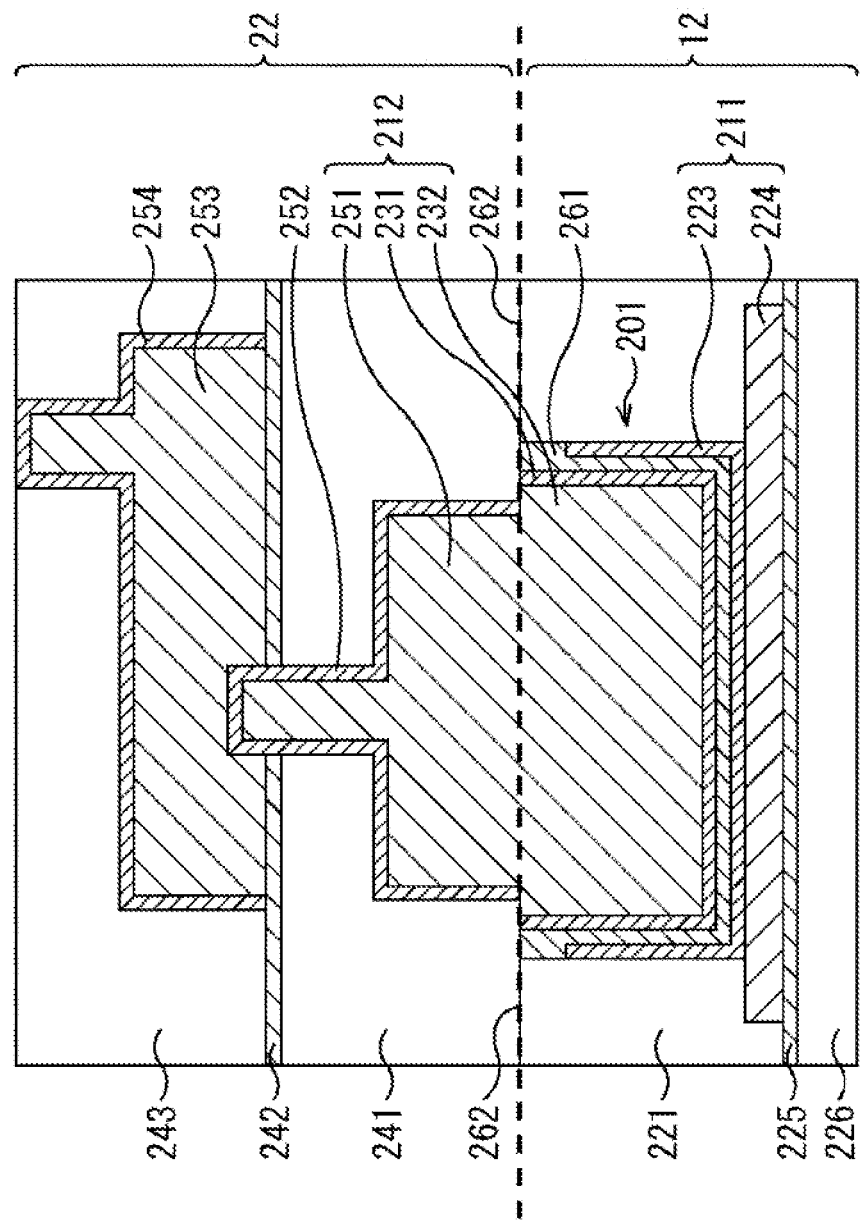
FIG. 8 is an enlarged sectional view of a modification of the sixth example configuration of wiring layers.

FIG. 8 shows an example in which the area of the metallic film 232 on the side of the multilayer wiring layer 12 in the planar direction is larger than the area of the metallic film 251 on the side of the multilayer wiring layer 22 in the planar direction.

Further, in the MIM capacitive element 201 shown in FIG. 7, the capacitive insulating film 261 is formed on the upper surface (outer surface) of the insulating layer 221 in contact with the junction plane. In the MIM capacitive element 201 shown in FIG. 8, however, only the ultra-thin insulating film 262 is formed, and the capacitive insulating film 261 is not formed.

In a case where the area of the metallic film 232 in the planar direction is larger than the area of the metallic film 251 of the multilayer wiring layer 22 in the planar direction as in the MIM capacitive element 201 shown in FIG. 8, the metallic film 251 forming part of the upper electrode 212 is not disposed above and on the outer side of the barrier metal 223 forming part of the lower electrode 211. Accordingly, the capacitive insulating film 261 on the upper surface (outer surface) of the insulating layer 221 in contact with the junction plane is not necessarily formed. The capacitive insulating film 261 may of course be formed on the upper surface of the insulating layer 221 as shown in FIG. 7.

Further, in either of the MIM capacitive element 201 shown in FIGS. 7 and 8, the position of the uppermost surface of the barrier metal 223 forming part of the lower electrode 211 is lower than the position of the uppermost surface of the barrier metal 231 forming part of the upper electrode 212.

In other words, the height of the barrier metal 223 forming part of the lower electrode 211 is set back (offset downward) from the junction plane indicated by a dashed line by a predetermined amount. This lowers the possibility of short-circuiting between the upper electrode 212 and the lower electrode 211, and thus, reliability can be increased.

<8. First Manufacturing Method>

Figure 9:
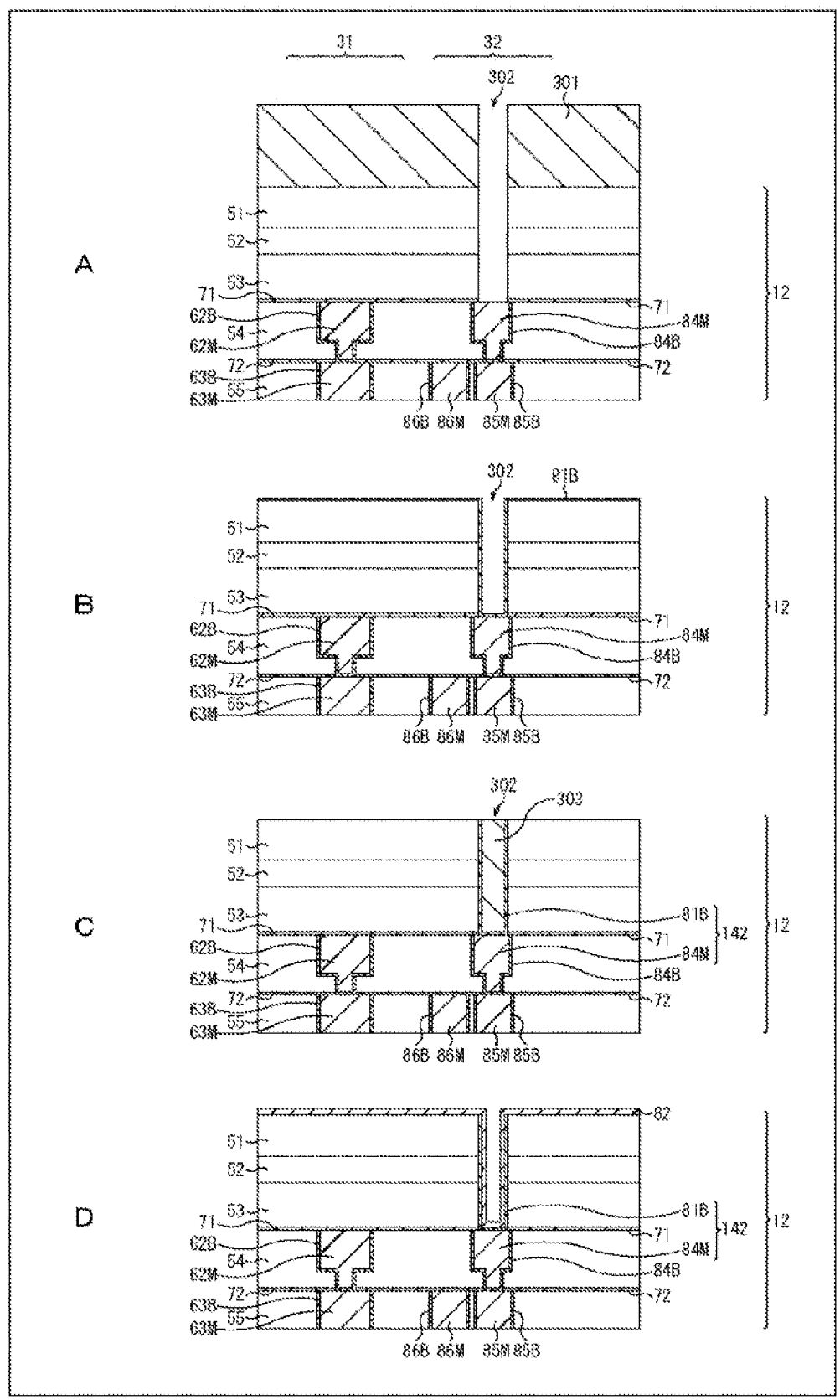
FIG. 9 is a diagram for explaining a method for manufacturing the first example configuration.
Figure 10:
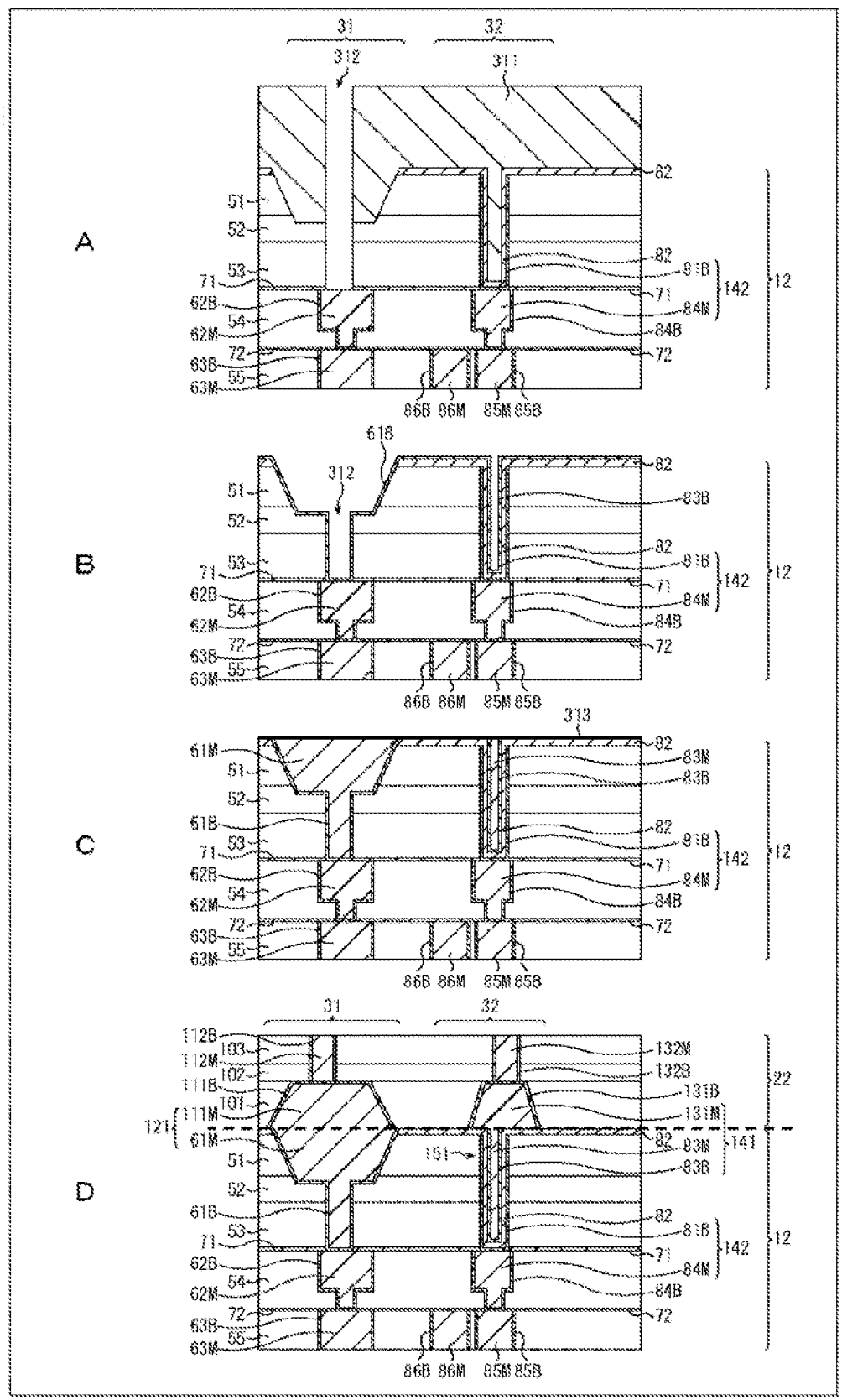
FIG. 10 is a diagram for explaining the method for manufacturing the first example configuration.

Next, a method for manufacturing the first example configuration of the wiring layers shown in FIG. 2 is described, with reference to FIGS. 9 and 10.

First, as shown in A of FIG. 9, after a predetermined metallic film and a barrier metal are formed in each of the first region 31 and the second region 32 of the insulating layer 54 and the insulating layer 55, a resist 301 is formed on the upper surface of the multilayer wiring layer 12 of the first semiconductor substrate 11 on which the insulating layers 51 through 53 are stacked. After that, patterning is performed on the resist 301 so that an opening is formed at the position to be connected to the metallic film 84M in the insulating layer 54 in the second region 32, and an opening 302 is formed by dry etching.

Next, as shown in B of FIG. 9, after the resist 301 is removed, the barrier metal 81B is formed by vapor deposition on the entire upper surface of the multilayer wiring layer 12 including the inner wall of the opening 302.

Next, as shown in C of FIG. 9, after a resist 303 is buried in the opening 302, etchback is performed on the entire upper surface of the insulating layer 51, and the barrier metal 81B other than the inner wall of the opening 302 is removed. In this etchback process, if an over-edge is set, the barrier metal 81B can be set back from the junction plane by a predetermined amount, like the barrier metal 81B' of the third example configuration shown in FIG. 4 and the barrier metal 223 of the sixth example configuration shown in FIG. 8.

After that, as shown in B of FIG. 9, the resist 303 buried in the opening 302 is removed, and the insulating film 82 to be the capacitive insulating film of the MIM capacitive element 151 is then formed on the inner wall of the opening 302 and the upper surface of the insulating layer 51.

Next, as shown in A of FIG. 10, etching for forming a trapezoidal pad shape in which the metallic film 61M is to be buried as the Cu pad 121 having a Cu—Cu junction structure is performed on the insulating layer 51 in the first region 31, and a resist 311 is then formed as a film on the upper surface on the multilayer wiring layer 12. After that, patterning is performed on the resist 311 so that an opening is formed at the position to be connected to the metallic film 62M in the insulating layer 54 in the first region 31, and an opening 312 is formed by dry etching.

Next, as shown in B of FIG. 10, the barrier metal 61B is formed by vapor deposition on the pad-shaped portions of the insulating layers 51 through 53 and the inner wall of the opening 312 in the first region 31.

Next, as shown in C of FIG. 10, after the metallic film 61M (conductive material) is buried in the pad-shaped portion of the insulating layer 51 and in the opening 312 in the first region 31, an ultra-thin insulating film 313 having a thickness of 1 nm or smaller is formed on the entire upper surface by atomic layer deposition (ALD), for example. This insulating film 313 corresponds to the insulating film 262 described above with reference to FIG. 7.

Next, as shown in D of FIG. 10, the multilayer wiring layer 22 of the second semiconductor substrate 21 is bonded to the multilayer wiring layer 12 of the first semiconductor substrate 11 by wafer bonding. The heat treatment at the time of wafer bonding causes the metallic film to expand in volume, the metallic film 61M and the metallic film HIM of the Cu pad 121 adhere to each other, and the metallic film 83M and the metallic film 131M of the upper electrode 141 of the MIM capacitive element 151 adhere to each other. In some cases, a small portion of the insulating film 313 between the metallic film 61M and the metallic film 111M, and a small portion of the insulating film 313 between the metallic film 83M and the metallic film 131M remain or have turned into voids, but this does not affect conductivity, and the Cu—Cu junction is maintained. The Cu—Cu junction includes a case where a small portion of the insulating film 313 remains or has turned into a void, without hindering conductivity as described above.

As the multilayer wiring layer 22 of the second semiconductor substrate 21 and the multilayer wiring layer 12 of the first semiconductor substrate 11 are bonded to each other by wafer bonding, the MIM capacitive element 151 including the upper electrode 141 and the lower electrode 142 is formed, with the insulating film 82 serving as the capacitive insulating film. The upper electrode 141 includes the metallic film 131M (a second conductive layer) of the multilayer wiring layer 22, and the metallic film 83M and the barrier metal 83B (a first conductive layer) of the multilayer wiring layer 12. The lower electrode 142 includes the barrier metal 81B and the metallic film 84M of the multilayer wiring layer 12.

By the first manufacturing method described so far, patterning of the metallic films (electrodes) serving as the process charge generation source that is the cause of process damage, and dry etching at the time of formation of the metallic film contacts of the upper and lower layers are performed before the insulating film 82 as the capacitive insulating film is formed, on the side of the multilayer wiring layer 12 of the first semiconductor substrate 11 including the lower electrode 142.

Meanwhile, on the side of the multilayer wiring layer 22 of the second semiconductor substrate 21 including the upper electrode 141, patterning of the metallic films (electrodes), and dry etching at the time of formation of the metallic film contacts of the upper and lower layers are also performed before the bonding.

After the insulating film 82 as the capacitive insulating film is formed, only the embedding and the wafer bonding of the metallic film 83M and the barrier metal 83B are further performed, and patterning of the metallic films (electrodes) and the dry etching for forming the metallic film contacts of the upper and lower layers are not performed. Thus, it is possible to form the MIM capacitive element 151, without causing process damage to the insulating film 82 serving as the capacitive insulating film. That is, by the first manufacturing method, it is possible to form a MIM capacitive element, without causing any process damage.

<9. Second Manufacturing Method>

Figure 11:
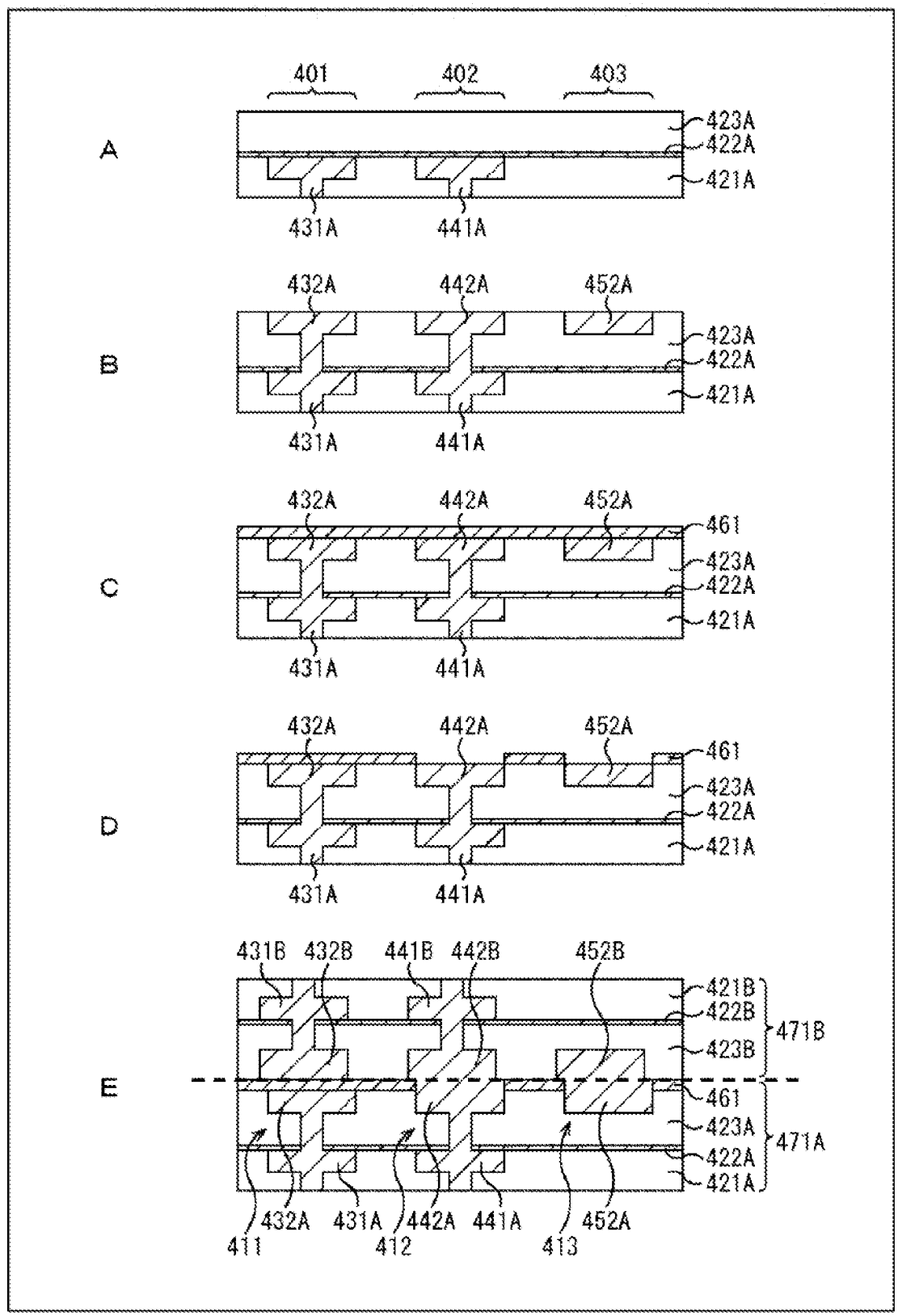
FIG. 11 is a diagram for explaining another method for manufacturing a MIM capacitive element.

Next, another method for manufacturing a MIM capacitive element that can be formed without any process damage is described, with reference to FIG. 11.

IG. 11 shows an example in which a MIM capacitive element 411 is formed in a first region 401 at the left side of wiring layers, a Cu pad 412 is formed in a second region 402 at the center, and a dummy pad 413 is formed in a third region 403 at the right side. The dummy pad 413 is a junction portion for forming a Cu—Cu junction like the Cu pad 412, to increase the area of the Cu—Cu junction, and reinforce the junction between two semiconductor substrates.

First, as shown in A of FIG. 11, a metallic film 431A and a metallic film 441A are formed by a damascene technique or the like in the first region 401 and the second region 402 of an insulating layer 421A formed on a first semiconductor substrate (not shown). After that, a cap film 422A and an insulating layer 423A are stacked on the entire upper surfaces of the metallic films 431A and 441A and the insulating layer 421A.

Next, as shown in B of FIG. 11, a metallic film 432A, a metallic film 442A, and a metallic film 452A are formed by a damascene technique or the like in the first region 401, the second region 402, and the third region 403 of the insulating layer 423A, respectively. The upper surfaces of the metallic film 432A, the metallic film 442A, and the metallic film 452A are formed in the same plane as the upper surface of the insulating layer 423A by CMP or the like. The metallic film 432A is connected to the metallic film 431A of the lower layer, and the metallic film 442A is connected to the metallic film 441A of the lower layer.

Next, as shown in C of FIG. 11, a high-dielectric-constant (high-k) insulating film 461 is formed by ALD or the like on the entire upper surfaces of the metallic films 432A, 442A, and 452A, and the insulating layer 423A. The material of the insulating film 461 may be hafnium oxide (HfO$_2$), aluminum oxide (Al$_2$O$_3$), titanium oxide (TiO$_2$), strontium titan oxide (STO), or the like, for example.

Next, as shown in D of FIG. 11, the insulating film 461 in the second region 402 and the third region 403 is removed by lithography and dry etching, so that the metallic film 442A and the metallic film 452A are exposed.

Then, as shown in E of FIG. 11, the corresponding metallic films of a multilayer wiring layer 471A formed on the first semiconductor substrate (not shown) through the steps shown in A through D of FIG. 11, and a multilayer wiring layer 471B formed on the second semiconductor substrate (not shown) likewise are connected to each other by wafer bonding.

The multilayer wiring layer 471B is formed with a stack of an insulating layer 421B, a cap film 422B, and an insulating layer 423B. In the first region 401 of the insulating layer 421B, a metallic film 431B corresponding to the metallic film 431A of the multilayer wiring layer 471A is formed. In the second region 402 of the insulating layer 421B, a metallic film 441B corresponding to the metallic film 441A of the multilayer wiring layer 471A is formed. In the first region 401 of the insulating layer 423B, a metallic film 432B corresponding to the metallic film 432A of the multilayer wiring layer 471A is formed. In the second region 402 of the insulating layer 423B, a metallic film 442B corresponding to the metallic film 442A of the multilayer wiring layer 471A is formed. In the third region 403 of the insulating layer 423B, a metallic film 452B corresponding to the metallic film 452A of the multilayer wiring layer 471A is formed.

In the second region 402 of the junction plane between the multilayer wiring layer 471A and the multilayer wiring layer 471B, the metallic film 442A and the metallic film 442B each expand in volume due to the heat treatment during the wafer bonding, and the metallic film 442A and the metallic film 442B are connected, to secure conductivity. Likewise, in the third region 403 of the junction plane, the metallic film 452A and the metallic film 452B each expand in volume, and the metallic film 452A and the metallic film 452B are connected.

In the above manner, the MIM capacitive element 411 having the insulating film 461 as the capacitive insulating film interposed between the metallic film 432B as the upper electrode and the metallic film 432A as the lower electrode is formed in the first region 401, the Cu pad 412 in which the metallic film 442A and the metallic film 442B are connected by metal joining is formed in the second region 402, and the dummy pad 413 in which the metallic film 452A and the metallic film 452B are connected by metal joining is formed in the third region 403.

Also in the above second manufacturing method, after the insulating film 461 serving as the capacitive insulating film of the MIM capacitive element 411 is formed, only the processing of the insulating film 461 and the wafer bonding are performed, and the patterning of the metallic films (electrodes) and the dry etching for forming the metallic film contacts of the upper and lower layers are not performed. Thus, it is possible to form the MIM capacitive element 411, without causing process damage to the insulating film 461 serving as the capacitive insulating film. That is, by the second manufacturing method, it is possible to form a MIM capacitive element, without causing any process damage.

<10. Third Manufacturing Method>

Figure 12:
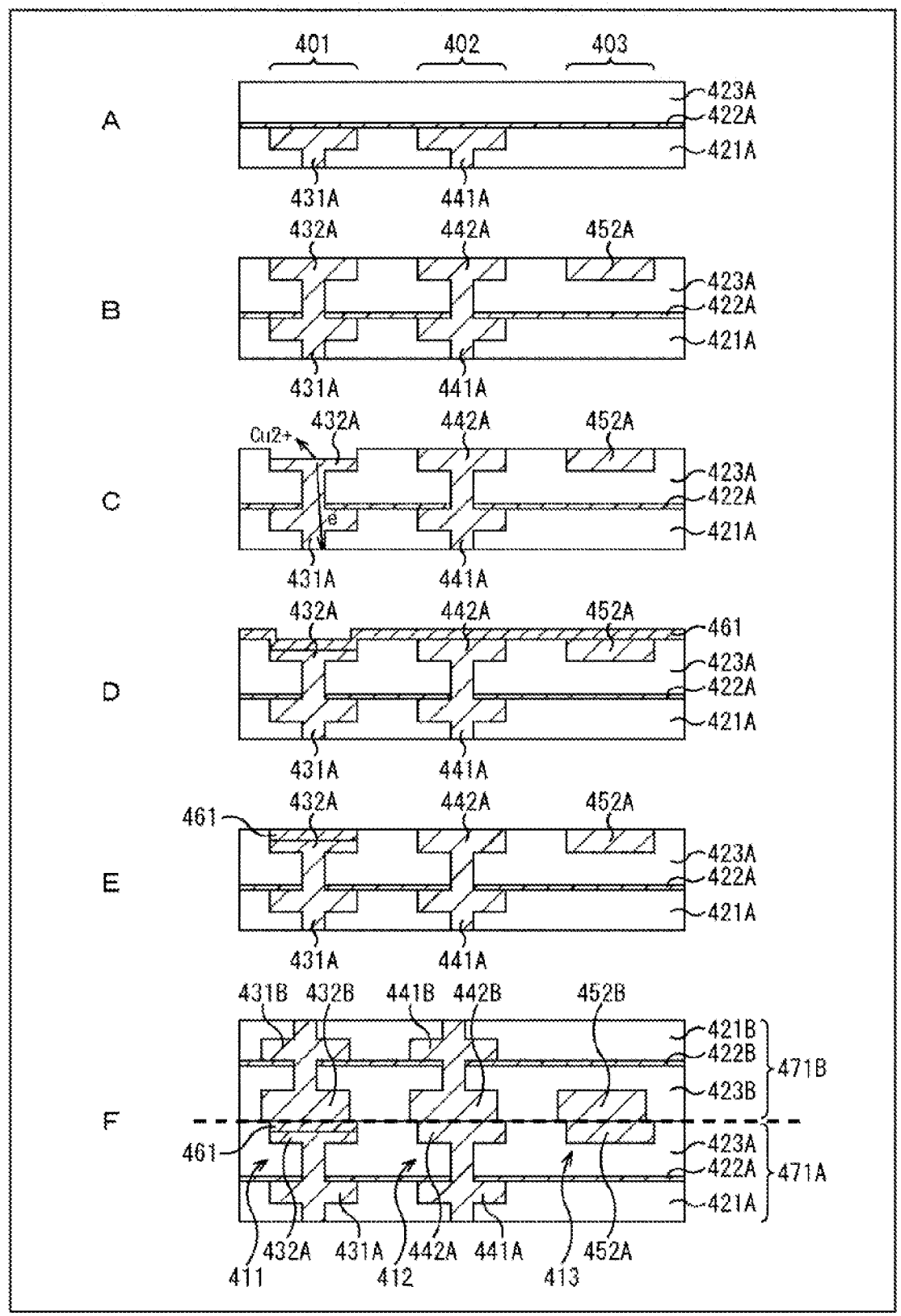
FIG. 12 is a diagram for explaining yet another method for manufacturing a MIM capacitive element.

Next, yet another method for manufacturing a MIM capacitive element that can be formed without any process damage is described, with reference to FIG. 12.

In FIG. 12, the components corresponding to those shown in FIG. 11 are denoted by the same reference numerals as those used in FIG. 11, and explanation of them is not made herein. Instead, the components and aspects different from those in the method described above with reference to FIG. 11 are now described.

By the method described with reference to FIG. 11, after the metallic film 432A, the metallic film 442A, and the metallic film 452A are formed in the insulating layer 423A, the upper surfaces thereof are formed to be in the same plane as the upper surface of the insulating layer 423A.

By the method illustrated in FIG. 12, on the other hand, the height of the metallic film 432A formed in the first region 401 is smaller than the height of the metallic film 442A in the second region 402 and the metallic film 452A in the third region 403, as shown in C of FIG. 12. The method for selectively turning the metallic film 432A formed in the first region 401 into a recess in the state of the uniform plane shown in B of FIG. 12 may be electrolytic etching or CMP dishing or the like, or lithography and dry etching.

After that, the high-dielectric-constant (high-k) insulating film 461 is formed by ALD or the like on the entire upper surfaces of the metallic films 432A, 442A, and 452A and the insulating layer 423A, as shown in D of FIG. 12. The insulating film 461 other than the portion to be the capacitive insulating film of the MIM capacitive element 411, which is the insulating film 461 on the upper surfaces of the metallic films 442A and 452A and the upper surface of the insulating layer 423A excluding the upper surface of the metallic film 432A, is then removed, as shown in E of FIG. 12.

Lastly, the corresponding metallic films of the multilayer wiring layer 471A formed on the first semiconductor substrate (not shown) and the multilayer wiring layer 471B formed on the second semiconductor substrate (not shown) are connected to each other by wafer bonding, as shown in F of FIG. 12.

In the above manner, the MIM capacitive element 411 is formed in the first region 401, the Cu pad 412 is formed in the second region 402, and the dummy pad 413 is formed in the third region 403.

Also in the above third manufacturing method, after the insulating film 461 serving as the capacitive insulating film of the MIM capacitive element 411 is formed, only the processing of the insulating film 461 and the wafer bonding are performed, and the patterning of the metallic films (electrodes) and the dry etching for forming the metallic film contacts of the upper and lower layers are not performed. Thus, it is possible to form the MIM capacitive element 411, without causing process damage to the insulating film 461 serving as the capacitive insulating film. That is, by the third manufacturing method, it is possible to form a MIM capacitive element, without causing any process damage.

<11. Example of Application to a Solid-State Imaging Device>

The MIM capacitive element 151 or the MIM capacitive element 201 described above can be applied to any device formed by joining two semiconductor substrates. In other words, the semiconductor device 1 shown in FIG. 1 may be any device such as a communication device, a control device, or a solid-state imaging device, for example.

Figure 13:
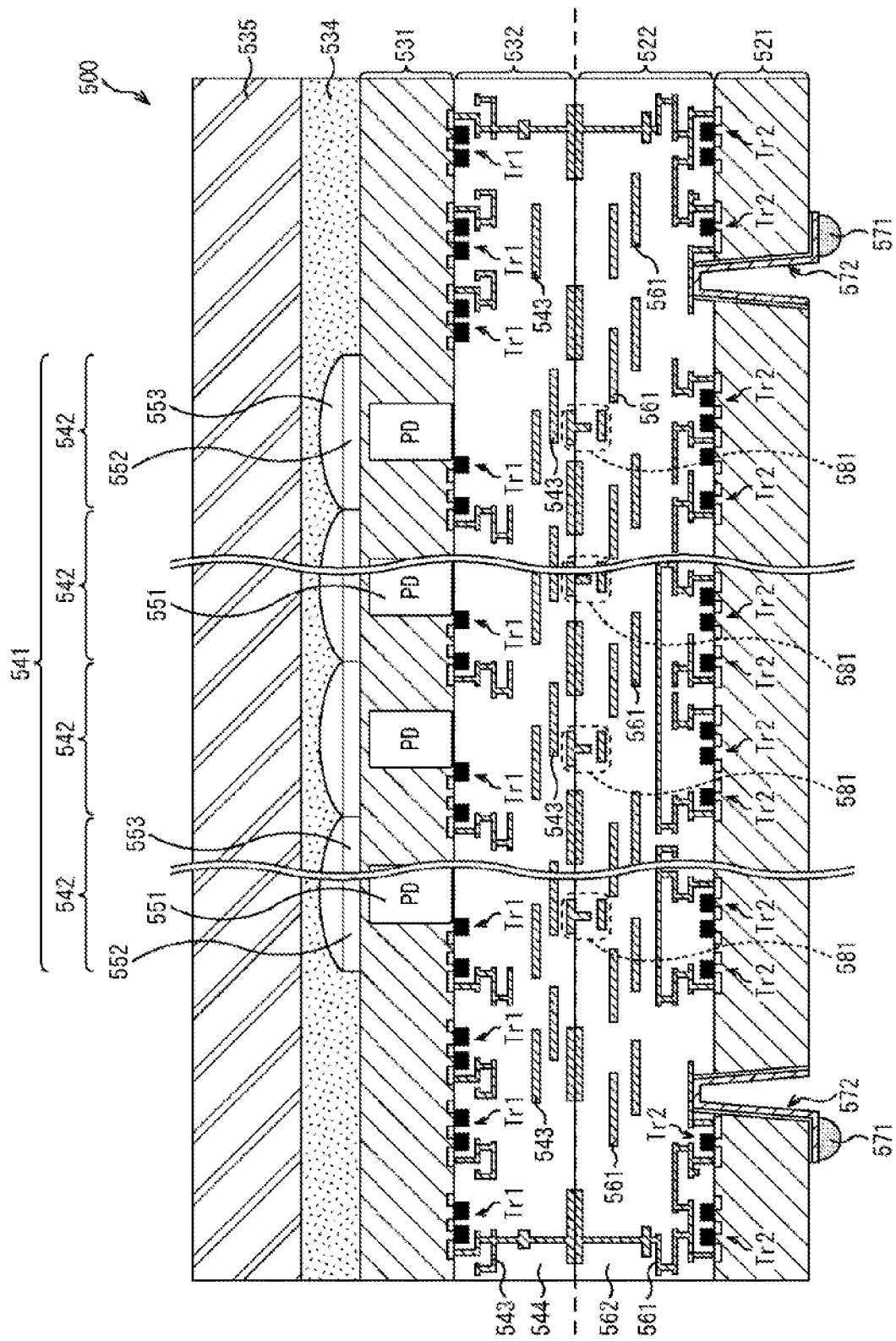
FIG. 13 is a diagram showing an example of application to a solid-state imaging device.

FIG. 13 shows an example in which the structure of a MIM capacitive element to which the present technology is applied is used in a solid-state imaging device formed by joining two semiconductor substrates.

A solid-state imaging device 500 shown in FIG. 13 includes a multilayer wiring layer 522 (a first multilayer wiring layer) formed on a first semiconductor substrate 521 (a first wafer) and a multilayer wiring layer 532 (a second multilayer wiring layer) formed on a second semiconductor substrate 531 (a second wafer), and the wiring layers are bonded to each other by wafer bonding.

The surface of light entrance to the solid-state imaging device 500 is the surface on the opposite side from the surface on which the multilayer wiring layer 532 of the second semiconductor substrate 531, which is the upper side in FIG. 13, is formed. In a pixel array region 541 of the solid-state imaging device 500, pixels 542 are arranged in a matrix.

On the upper surface of the second semiconductor substrate 531, which is the surface of light entrance, color filters 552 of red (R), green (G), or blue (B), and on-chip lenses 553 are formed for the respective pixels, for example. In the second semiconductor substrate 531 under the color filters 552, photodiodes (PDs) 551 that are photoelectric conversion elements using P-N junctions are formed for the respective pixels.

On the upper side of the on-chip lenses 553 formed on the upper surface of the second semiconductor substrate 531, which is the surface of light entrance, a protective substrate 535 for protecting the structures in the solid-state imaging device 500, particularly the on-chip lenses 553 and the color filters 552, are disposed via a sealing resin 534. The protective substrate 535 is a transparent glass substrate, for example.

The multilayer wiring layer 532 formed on the lower surface of the second semiconductor substrate 531 includes a plurality of wiring layers 543 and an interlayer insulating film 544 formed between the wiring layers 543. A large number of transistors Tr1 are formed at the interface between the multilayer wiring layer 532 and the second semiconductor substrate 531. These transistors Tr1 are transistors that control photoelectric conversion operations and operations of reading photoelectrically converted electrical signals, or transistors forming signal processing circuits or the like, for example.

Meanwhile, the multilayer wiring layer 522 of the first semiconductor substrate 521, which faces and is joined to the multilayer wiring layer 532 of the second semiconductor substrate 531, includes a plurality of wiring layers 561 and an interlayer insulating film 562 formed between the wiring layers 561. A large number of transistors Tr2 forming logic circuits are also formed at the interface between the multilayer wiring layer 522 and the first semiconductor substrate 521.

On the surface on the opposite side from the surface on which the multilayer wiring layer 522 of the first semiconductor substrate 521, which is the lower side in FIG. 13, a plurality of external terminals 571 are formed, and the external terminals 571 is connected to predetermined wiring layers 561 of the multilayer wiring layer 522 via through vias 572 penetrating the first semiconductor substrate 521. The external terminals 571 are formed with solder balls, for example, and receive power supply from outside, and perform signal inputs/outputs.

In the junction plane between the multilayer wiring layer 522 and the multilayer wiring layer 532 of the solid-state imaging device 500 formed as described above, a capacitive element formed by wafer bonding without process damage, like the MIM capacitive element 151 or the MIM capacitive element 201 described above, is disposed in each region 581 indicated by a dashed line, for example. Depending on the purpose of use and the location of the circuit, the MIM capacitive element 151 and the MIM capacitive element 201 having different structures of the first through fifth example configurations may be combined and disposed in the solid-state imaging device 500 as appropriate.

The present technology may be applied not only to a solid-state imaging device but also to any semiconductor device having a semiconductor integrated circuit.

Embodiments of the present technology are not limited to the above described embodiments, and various modifications may be made to them without departing from the scope of the present technology.

For example, it is possible to adopt a combination of all or some of the embodiments described above.

Note that the advantageous effects described in this specification are merely examples, and the advantageous effects of the present technology are not limited to them and may include effects other than those described in this specification.

Note that the present technology may also be embodied in the configurations described below.

(1)

A semiconductor device including:

a first multilayer wiring layer formed on a first semiconductor substrate, and a second multilayer wiring layer formed on a second semiconductor substrate, wiring layers of the first multilayer wiring layer and the second multilayer wiring layer being bonded to each other by wafer bonding; and a capacitive element including an upper electrode, a lower electrode, and a capacitive insulating film between the upper electrode and the lower electrode, in which one electrode of the upper electrode and the lower electrode is formed with a first conductive layer of the first multilayer wiring layer and a second conductive layer of the second multilayer wiring layer.

(2)

The semiconductor device according to (1), in which the first conductive layer and the second conductive layer constituting the one electrode are connected directly to each other.

(3)

The semiconductor device according to (1) or (2), in which the first conductive layer and the second conductive layer constituting the one electrode are connected to each other at a junction plane of the wafer bonding.

(4)

The semiconductor device according to any one of (1) to (3), in which junction planes of the first conductive layer and the second conductive layer constituting the one electrode are in the same plane.

(5)

The semiconductor device according to any one of (1) to (4), in which areas of junction planes of the first conductive layer and the second conductive layer are designed such that one of the first conductive layer and the second conductive layer is larger.

(6)

The semiconductor device according to any one of (1) to (5), in which the one electrode includes a barrier metal formed on an inner wall of a groove formed in a depth direction of an insulating layer, and a position of an upper surface of the barrier metal is lower than a position of an upper surface of the insulating layer by a predetermined amount.

(7)

A semiconductor device manufacturing method, including:

bonding a wiring layer of a first multilayer wiring layer formed on a first semiconductor substrate and a wiring layer of a second multilayer wiring layer formed on a second semiconductor substrate to each other by wafer bonding, to form a capacitive element including an upper electrode, a lower electrode, and a capacitive insulating film between the upper electrode and the lower electrode; and forming one electrode of the upper electrode and the lower electrode with a first conductive layer of the first multilayer wiring layer and a second conductive layer of the second multilayer wiring layer.

(8)

The semiconductor device manufacturing method according to (7), further including:

forming an opening by removing part of an insulating layer of the first multilayer wiring layer formed on the first semiconductor substrate; and after forming the capacitive insulating film in the opening, burying a conductive material to be the first conductive layer, and bonding the conductive material of the first conductive layer of the first multilayer wiring layer and a conductive material of the second conductive layer of the second multilayer wiring layer to each other by wafer bonding.

(9)

A semiconductor device manufacturing method, including:

forming a capacitive insulating film on upper surfaces of a first conductive layer and a second conductive layer of a first multilayer wiring layer formed on a first semiconductor substrate;

removing the capacitive insulating film on the upper surface of the second conductive layer of the first multilayer wiring layer;

bending a third conductive layer and a fourth conductive layer of a second multilayer wiring layer formed on a second semiconductor substrate to the first conductive layer and the second conductive layer, respectively, to form a capacitive element having the capacitive insulating film interposed between the first conductive layer as an upper electrode and the third conductive layer as a lower electrode, the third conductive layer and the fourth conductive layer facing the first conductive layer and the second conductive layer, respectively; and connecting the second conductive layer and the fourth conductive layer by metal joining.

(10)

The semiconductor device manufacturing method according to (9), further including:

forming the upper surfaces of the first conductive layer and the second conductive layer in the same plane;

forming a capacitive insulating film on the upper surfaces of the first conductive layer and the second conductive layer formed in the same plane;

removing the capacitive insulating film on the upper surface of the second conductive layer; and bonding the third conductive layer and the fourth conductive layer of the second multilayer wiring layer formed on the second semiconductor substrate to the first conductive layer and the second conductive layer, respectively, the third conductive layer and the fourth conductive layer facing the first conductive layer and the second conductive layer, respectively.

(11)

The semiconductor device manufacturing method according to (9), further including:

making a height of the upper surface of the first conductive layer smaller than a height of the second conductive layer;

removing the capacitive insulating film on the upper surface of the second conductive layer, which is made higher than the first conductive layer; and bonding the third conductive layer and the fourth conductive layer of the second multilayer wiring layer formed on the second semiconductor substrate to the first conductive layer and the second conductive layer, respectively, the third conductive layer and the fourth conductive layer facing the first conductive layer and the second conductive layer, respectively.

REFERENCE SIGNS LIST

1 Semiconductor device
11 First semiconductor substrate
12 Multilayer wiring layer
21 Second semiconductor substrate
22 Multilayer wiring layer
51 through 55 Insulating layer
81B Barrier metal
82 Insulating film
83B Barrier metal
83M Metallic film
84M Barrier metal
121 Cu pad
131M Metallic film
141 Upper electrode
142 Lower electrode
151 MIM capacitive element
201 MIM capacitive element
211 Lower electrode
212 Upper electrode
261 capacitive insulating film
262 Insulating film
302 Opening
411 MIM capacitive element
412 Cu pad
500 Solid-state imaging device

What is claimed is:
1. A semiconductor device, comprising:
a first multilayer wiring layer formed on a first semiconductor substrate, and a second multilayer wiring layer formed on a second semiconductor substrate, wiring layers of the first multilayer wiring layer and the second multilayer wiring layer being bonded to each other by wafer bonding; and a capacitive element including an upper electrode, a lower electrode, and a capacitive insulating film between the upper electrode and the lower electrode, wherein one electrode of the upper electrode and the lower electrode is formed with a first conductive layer of the first multilayer wiring layer and a second conductive layer of the second multilayer wiring layer, wherein the one electrode includes a barrier metal formed on an inner wall of a groove formed in a depth direction of an insulaing layer, and wherein a position of an upper surface of the barrier metal is lower than a position of an upper surface of the insulating layer by a predetermined amount.

2. The semiconductor device according to claim 1, wherein the first conductive layer and the second conductive layer constituting the one electrode are connected directly to each other.

3. The semiconductor device according to claim 1, wherein the first conductive layer and the second conductive layer constituting the one electrode are connected to each other at a junction plane of the wafer bonding.

4. The semiconductor device according to claim 1, wherein junction planes of the first conductive layer and the second conductive layer constituting the one electrode are in the same plane.

5. The semiconductor device according to claim 1, wherein areas of junction planes of the first conductive layer and the second conductive layer are designed such that one of the first conductive layer and the second conductive layer is larger.

6. A semiconductor device manufacturing method, comprising:

bonding a wiring layer of a first multilayer wiring layer formed on a first semiconductor substrate and a wiring layer of a second multilayer wiring layer formed on a second semiconductor substrate to each other by wafer bonding to form a capacitive element including an upper electrode, a lower electrode, and a capacitive insulating film between the upper electrode and the lower electrode;

forming one electrode of the upper electrode and the lower electrode with a first conductive layer of the first multilayer wiring layer and a second conductive layer of the second multilayer wiring layer, forming an opening by removing part of an insulating layer of the first multilayer wiring layer formed on the first semiconductor substrate; and after forming the capacitive insulating film in the opening, burying a conductive material to be the first conductive layer, and bonding the conductive material of the first conductive layer of the first multilayer wiring layer and a conductive material of the second conductive layer of the second multilayer wiring layer to each other by wafer bonding.

* * * * *